US011050002B2

(12) United States Patent
Pfeuffer et al.

(10) Patent No.: US 11,050,002 B2
(45) Date of Patent: Jun. 29, 2021

(54) METHOD FOR PRODUCING A SEMICONDUCTOR CHIP AND SEMICONDUCTOR CHIP

(71) Applicant: OSRAM Opto Semiconductors GmbH, Regensburg (DE)

(72) Inventors: Alexander F. Pfeuffer, Regensburg (DE); Dominik Scholz, Bad Abbach (DE)

(73) Assignee: OSRAM OLED GMBH, Regensburg (DE)

( * ) Notice: Subject to any disclaimer, the term of this patent is extended or adjusted under 35 U.S.C. 154(b) by 80 days.

(21) Appl. No.: 15/765,474

(22) PCT Filed: Sep. 29, 2016

(86) PCT No.: PCT/EP2016/073319
§ 371 (c)(1),
(2) Date: Apr. 2, 2018

(87) PCT Pub. No.: WO2017/060158
PCT Pub. Date: Apr. 13, 2017

(65) Prior Publication Data
US 2018/0309027 A1    Oct. 25, 2018

(30) Foreign Application Priority Data
Oct. 5, 2015    (DE) .......................... 102015116865.0

(51) Int. Cl.
*H01L 33/38*    (2010.01)
*H01L 33/00*    (2010.01)
(Continued)

(52) U.S. Cl.
CPC ........ *H01L 33/382* (2013.01); *H01L 33/0093* (2020.05); *H01L 33/30* (2013.01);
(Continued)

(58) Field of Classification Search
CPC . H01L 2924/053; H01L 33/382; H01L 33/30; H01L 33/40; H01L 33/44; H01L 2933/0016
See application file for complete search history.

(56) References Cited

U.S. PATENT DOCUMENTS

| 4,352,187 A | 9/1982 | Amann |
| 6,979,842 B2 | 12/2005 | Stein et al. |

(Continued)

FOREIGN PATENT DOCUMENTS

| DE | 10261675 A1 | 7/2004 |
| DE | 10261676 A1 | 7/2004 |

(Continued)

OTHER PUBLICATIONS

Cao, X.A. et al., "Electrical Effects of Plasma Damage in p-GaN," Applied Physics Letters, vol. 75, No. 17, Oct. 25, 1999, 3 pages.

(Continued)

*Primary Examiner* — Eugene Lee
(74) *Attorney, Agent, or Firm* — Slater Matsil, LLP

(57) ABSTRACT

A method for producing a semiconductor chip and a semiconductor chip are disclosed. In an embodiment, the method includes providing a semiconductor layer sequence having a first semiconductor layer and a second semiconductor layer, wherein the first semiconductor layer is formed as a p-conducting semiconductor region and the second semiconductor layer is formed as an n-conducting semiconductor region, or vice versa, forming at least one recess in the semiconductor layer sequence so that side surfaces of the first and second semiconductor layers are exposed, wherein the recess is multiple times wider than deep and applying an auxiliary layer for electrically contacting the second semiconductor layer, wherein the auxiliary layer at the side surfaces exposed.

18 Claims, 9 Drawing Sheets

(51) Int. Cl.
*H01L 33/30* (2010.01)
*H01L 33/40* (2010.01)
*H01L 33/44* (2010.01)

(52) U.S. Cl.
CPC .............. *H01L 33/40* (2013.01); *H01L 33/44* (2013.01); *H01L 2933/0016* (2013.01)

(56) References Cited

U.S. PATENT DOCUMENTS

| | | | |
|---|---|---|---|
| 8,895,337 B1* | 11/2014 | Wang | H01L 33/18 257/E29.005 |
| 9,054,016 B2 | 6/2015 | Moosburger et al. | |
| 9,257,612 B2 | 2/2016 | Höppel et al. | |
| 9,530,935 B2 | 12/2016 | Neumann | |
| 9,761,772 B2 | 9/2017 | Pfeuffer | |
| 2004/0004226 A1 | 1/2004 | Eisert et al. | |
| 2004/0262620 A1 | 12/2004 | Albrecht et al. | |
| 2005/0253155 A1* | 11/2005 | Wirth | H01L 33/62 257/88 |
| 2010/0012971 A1* | 1/2010 | Hiraoka | H01L 33/38 257/103 |
| 2012/0291856 A1* | 11/2012 | Sheats | H01L 31/0322 136/251 |
| 2013/0306964 A1* | 11/2013 | Han | H01L 33/382 257/43 |
| 2014/0283903 A1 | 9/2014 | von Malm et al. | |
| 2014/0305505 A1* | 10/2014 | Park | H01L 31/022425 136/262 |
| 2015/0255692 A1* | 9/2015 | Pfeuffer | H01L 33/405 438/27 |
| 2015/0270446 A1* | 9/2015 | Neumann | H01L 33/0079 257/98 |
| 2016/0218240 A1* | 7/2016 | Bouvier | H01L 33/0095 |
| 2016/0336488 A1* | 11/2016 | Bower | H01L 33/26 |
| 2017/0062351 A1 | 3/2017 | von Malm et al. | |

FOREIGN PATENT DOCUMENTS

| | | | |
|---|---|---|---|
| DE | 20320295 U1 | 8/2004 | |
| DE | 102009006177 A1 | 6/2010 | |
| DE | 102010024079 A1 | 12/2011 | |
| DE | 102011115659 A1 | 3/2013 | |
| DE | 102012106953 A1 * | 1/2014 | H01L 33/20 |
| DE | 102012106953 A1 | 1/2014 | |
| DE | 102012107921 A1 | 3/2014 | |
| DE | 102014102029 A1 | 8/2015 | |
| WO | 2014033041 A1 | 3/2014 | |
| WO | WO-2014033041 A1 * | 3/2014 | H01L 33/44 |

OTHER PUBLICATIONS

Cao, X.A. et al., "Plasma Damage in p-GaN," Journal of Electronic Materials, vol. 29, No. 3, Special Issue Paper, 2000, 2 pages.

Lim, J.H. et al., "Highly Transparent ZnO Spreading Layer for GaN Based LED," Phys. Stat. Sol. (c) 2, No. 7, 2533-2535, (2005)/DOI 10.1002/pssc.200461438, 2005, 4 pages.

Ping, A.T. et al., "The Effects of Reactive Ion Etching-Induced Damage on the Characteristics of Ohmic Contacts to n-Type GaN," Journal of Electronic Materials, vol. 27, No. 4, Special Issue Paper, 1998, 6 pages.

* cited by examiner

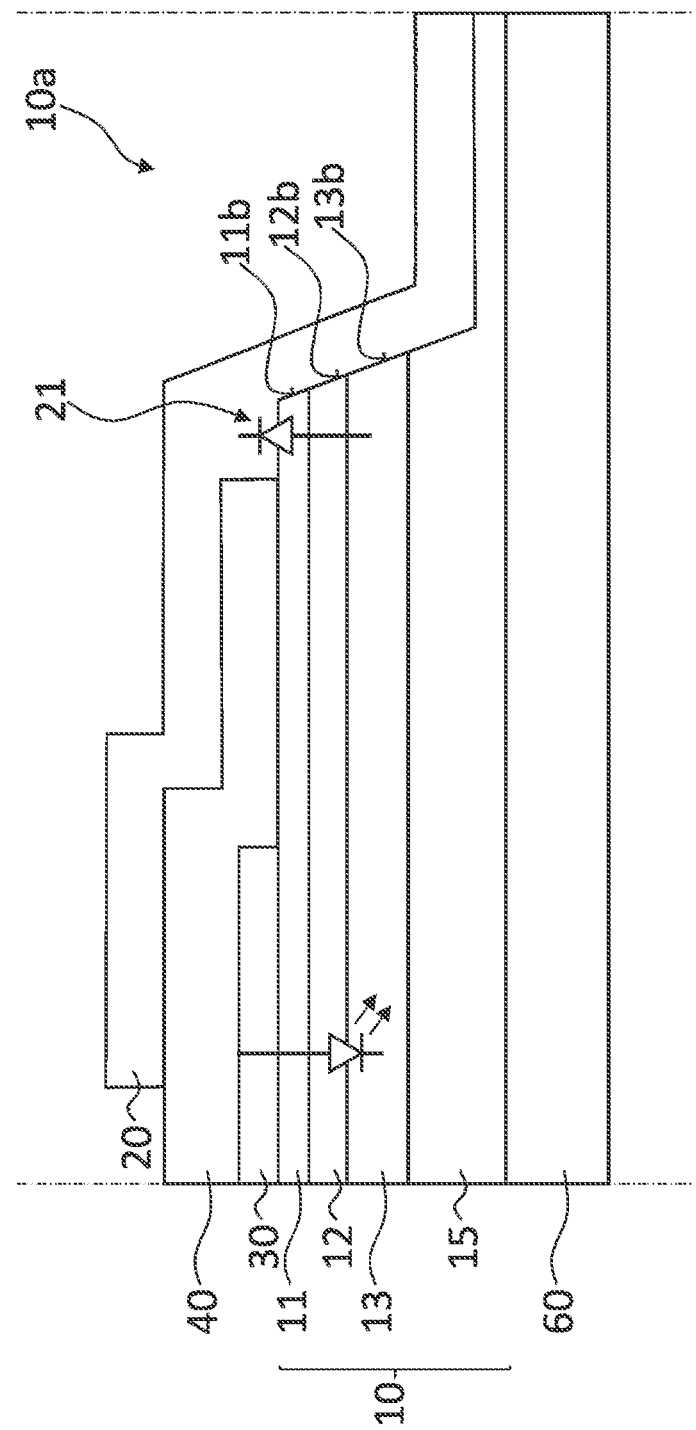

METHOD FOR PRODUCING A SEMICONDUCTOR CHIP AND SEMICONDUCTOR CHIP

This patent application is a national phase filing under section 371 of PCT/EP2016/073319, filed Sep. 29, 2016, which claims the priority of German patent application 10 2015 116 865.0, filed Oct. 5, 2015, each of which is incorporated herein by reference in its entirety.

TECHNICAL FIELD

The invention relates to a method for producing a semiconductor chip and to a semiconductor chip.

SUMMARY OF THE INVENTION

Embodiments of the invention provide a method for producing a semiconductor chip and a corresponding semiconductor chip which has a high efficiency during operation.

According to a first aspect, a method for producing a semiconductor chip is specified. The semiconductor chip can be a semiconductor chip in the field of microelectronics, for example, an integrated circuit. In particular, the semiconductor chip can be an optoelectronic semiconductor chip such as a radiation-receiving semiconductor chip or a light-emitting semiconductor chip. For example, the semiconductor chip is a photodiode, a solar cell, a light-emitting diode chip or a laser.

In at least one embodiment according to the first aspect, a semiconductor layer sequence having a first semiconductor layer and a second semiconductor layer is provided. By way of example, the first semiconductor layer is formed as a p-conducting semiconductor region, and the second semiconductor layer is formed as an n-conducting semiconductor region, or vice versa. The semiconductor layer sequence is deposited epitaxially on a growth substrate, for example. The growth substrate can be formed, for example, with sapphire or silicon.

Further, the semiconductor layer sequence can comprise an active region. The active region can be produced between the first and the second semiconductor layer. A function of the semiconductor chips takes place in the active region. For example, the active region can be provided in a finished optoelectronic semiconductor chip for receiving or generating electromagnetic radiation. Furthermore, the semiconductor layer sequence can comprise further semiconductor regions, such as buffer regions for crystallographic adjustments, etching stop layers, sacrificial layers, current spreading layers and contact layers. Furthermore, it is possible for the semiconductor layer sequence to have already structured regions and/or metal structures such as a metallic mirror layer, a metal grid for current spreading, electrical contacting or current embossing or other current spreading layers.

For example, the semiconductor layer sequence, in particular the active region, contains a III-V compound semiconductor material. III-V compound semiconductor materials are particularly suitable for generating radiation in the ultraviolet ($Al_x In_y Ga_{1-x-y} N$) over the visible ($Al_x In_y Ga_{1-x-y} N$, in particular for blue to green radiation, or $Al_x In_y Ga_{1-x-y} P$, in particular for yellow to red radiation) up to the infrared ($Al_x In_y Ga_{1-x-y} As$) spectral range. In this case, $0 \leq x \leq 1$, $0 \leq y \leq 1$ and $x+y \leq 1$ apply, in particular with $x \neq 1$, $y \neq 1$, $x \neq 0$ and/or $y \neq 0$. With III-V compound semiconductor materials, in particular from the material systems mentioned, high internal quantum efficiencies can furthermore be achieved during radiation generation.

In at least one embodiment according to the first aspect, at least one recess is formed in the semiconductor layer sequence, so that side surfaces of the first semiconductor layer and of the second semiconductor layer are exposed. In this context, it is also possible, in particular, to expose side surfaces of further semiconductor regions. The respective recess can be formed in this case, for example, by means of dry or wet-chemical etching. For example, the respective recess has a circular shape in lateral directions, that is to say parallel or substantially parallel to a main extent of the semiconductor layer sequence. The respective recess can then serve, for example, as a through-connection (so-called 'via'). In this case, the semiconductor layer sequence can be removed completely or only partially in the region of the recess. Deviating therefrom or in addition, it is also conceivable for the respective recess to assume a grid structure in lateral directions, as can be the case, for example, in order to form a mesa. In particular, chlorine-containing plasma can be used for this purpose.

The lateral directions are in particular perpendicular or substantially perpendicular to a growth direction of the semiconductor layer sequence. The lateral surfaces exposed by the respective recess can enclose a steep angle, for example, greater than 75°, with the lateral directions. Alternatively, in additional process steps, lacquer can be applied, for example, positive resist, with the use of which also flatter angles can be realized, for example, between 45% and 75%. This can simplify, in particular, subsequent overforming steps.

For example, the respective recess can extend with a depth of at least 100 nm to at most 2000 nm into the semiconductor layer sequence, or through the latter. Preferably, a depth of the respective recess is between 300 nm and 1000 nm. A lateral extent of a bottom surface of the respective recess can be at least 1 μm to at most 100 μm, preferably between 5 μm and 50 μm. In other words, the respective recess can thus be designed to be multiple times wider than deep.

The side faces of the first and second semiconductor layers and optional intermediate layers exposed by the respective recess have an extent towards the bottom surface of the respective recess which is delimited by the depth of the respective recess. Thus, a surface ratio of the side surfaces of the first and second semiconductor layers and optional intermediate layers exposed by the respective recess to further surfaces, exposed by the respective recess and delimiting the respective recess, can be less than 1:3, for example, less than 1:10, in particular less than 1:100.

In at least one embodiment according to the first aspect, an auxiliary layer is applied for electrically contacting the second semiconductor layer. After this step, the auxiliary layer is at least partially in direct contact with the first semiconductor layer at the side surfaces exposed by the respective recess. In particular, in this context, the uncovered side surfaces of the first semiconductor layer and/or of the further semiconductor regions can also be at least partially covered so that the auxiliary layer is in direct contact with a plurality of semiconductor layers or regions of the semiconductor layer sequence after this step. The auxiliary layer can be applied, for example, by sputtering. In this case, the auxiliary layer can be deposited as a closed layer, in particular in the region of the respective recess. A layer thickness of the auxiliary layer is, for example, between at least 5 nm and at most 200 nm. A layer thickness of 10 nm to 50 nm is preferred.

The auxiliary layer serves in particular for electrically contacting the second semiconductor layer. In other words, during operation of the semiconductor chip, the auxiliary layer has a good electrical conductivity with respect to the second semiconductor layer. A contact resistance between the auxiliary layer and the second semiconductor layer can thus be, for example, at least $5*10^{-6}$ $\Omega*cm^2$ and at most $1*10^{-4}$ $\Omega*cm^2$. When an operating voltage is applied, a current flow is thus made possible indirectly or directly between the auxiliary layer and the second semiconductor layer.

The auxiliary layer furthermore has, in particular, a poor electrical conductivity with respect to the first semiconductor layer. A contact resistance between the auxiliary layer and the first semiconductor layer can therefore be several orders of magnitude higher than in the aforementioned case. For example, the contact resistance is then at least 10 to 100 times, in particular more than 100 times, preferably more than 1000 times the aforementioned upper range limit, that is to say at least more than $1*10^{-3}$ $\Omega*cm^2$. With regard to a functionality of the semiconductor chip, a current flow between the auxiliary layer and the first semiconductor layer is substantially prevented.

In other words, the auxiliary layer is a contact material which selectively has only a good electrical contact with the second semiconductor layer. By way of example, the contact material, on the other hand, forms a blocking diode to the first semiconductor layer during operation of the semiconductor chip. Alternatively or additionally, the contact material forms a greatly increased ohmic contact resistance to the first semiconductor layer during operation of the semiconductor chip.

In at least one embodiment according to the first aspect, first, a semiconductor layer sequence having a first semiconductor layer and a second semiconductor layer is provided. Subsequently, at least one recess is formed in the semiconductor layer sequence so that side surfaces of the first semiconductor layer and of the second semiconductor layer are exposed. An auxiliary layer for electrically contacting the second semiconductor layer is subsequently applied. After this step, the auxiliary layer is at least partially in direct contact with the first semiconductor layer at the side surfaces exposed by the respective recess.

The side surfaces of the semiconductor layer sequence exposed during the formation of the respective recess represent a sensitive region. For example, this region can be susceptible to defects, by means of which increased leakage currents can occur at the exposed side surfaces, or a failure of the semiconductor chip can be brought about. For further processing, it may therefore be necessary to passivate or electrically insulate this region. By applying the auxiliary layer, an extrinsic passivation material can be dispensed with. In particular, subsequent structuring steps can thus be saved so that a simple, cost-effective and time-saving production of the semiconductor chip is enabled.

The semiconductor layer sequence can in particular have electrical contacts, contact layers or contact layer sequences, via which a respective electrical contacting of the first semiconductor layer or of the second semiconductor layer essentially takes place. For example, in this context, a current spreading layer is arranged within the second semiconductor layer, or on a side of the second semiconductor layer facing away from the first semiconductor layer. Side surfaces of the current spreading layer can be exposed through the respective recess. Alternatively or additionally, the respective recess can extend into the current spreading layer in such a way that a bottom surface of the respective recess is formed by an exposed surface of the current spreading layer. An indirect electrical contacting of the second semiconductor layer through the auxiliary layer can then take place, for example, via the exposed side surfaces and/or surface of the current spreading layer.

The electrical contacting of the second semiconductor layer thus takes place from the side of the second semiconductor layer facing the first semiconductor layer. The first semiconductor layer can likewise be electrically contacted from this side, for example, by means of a metallic mirror layer applied to a side of the first semiconductor layer facing away from the second semiconductor layer.

The introduction of an additional dielectric between the auxiliary layer and the first semiconductor layer is advantageously only optional. An anisotropic etching back of the dielectric can thus also be dispensed with in this context. This simplifies a process flow for producing the semiconductor chip, since both the deposition of the dielectric and the structuring thereof can be omitted so that a cost-effective production of the semiconductor chip is applied. Furthermore, increased reliability of the semiconductor chip and thus an increased yield during production are made possible. In addition, one and the same material is advantageously used for contacting and for insulating, depending on which layer the material is adjacent to.

According to a second aspect, a semiconductor chip is specified. The semiconductor chip comprises a semiconductor layer sequence having a first semiconductor layer and a second semiconductor layer. The semiconductor chip has at least one recess in the semiconductor layer sequence, by means of which the side surfaces of the first semiconductor layer and of the second semiconductor layer are exposed. The semiconductor chip further comprises an auxiliary layer for electrically contacting the second semiconductor layer. The auxiliary layer is at least partially in direct contact with the first semiconductor layer at the side surfaces exposed by the respective recess.

The semiconductor chip according to the second aspect is in particular the semiconductor chip produced by means of the method described above according to the first aspect, so that all of the features disclosed for the method are also disclosed for the semiconductor chip and vice versa.

The embodiments specified below relate both to the method described here and to semiconductor chips described here.

In at least one embodiment according to the first and/or second aspect, the auxiliary layer forms a diode with the first semiconductor layer. In particular, the diode is designed such that it blocks during operation of the semiconductor chip, that is to say when an operating voltage is applied. This advantageously contributes to a high ESD strength of the semiconductor chip. In other words, the diode is connected anti-parallel with respect to the first and second semiconductor layers, in particular antiparallel with regard to a pn-junction.

In at least one further embodiment according to the first and/or second aspect, the auxiliary layer comprises a transparent conductive oxide (TCO) or consists thereof. Transparent conductive oxides are transparent, conductive materials, generally metal oxides, such as, for example, indium tin oxide or zinc oxide.

In at least one further embodiment according to the first and/or second aspect, the auxiliary layer comprises or consists of a metal. By way of example, this can be aluminum, titanium or rhodium. In an advantageous manner, the auxiliary layer can then form a Schottky diode, which is in reverse direction to the first semiconductor layer during operation of the semiconductor chip. By way of example, the first semiconductor layer is of p-GaN.

In at least one further embodiment according to the first and/or second aspect, the auxiliary layer comprises or consists of an extrinsic doped semiconductor material. By way of example, this can be doped amorphous silicon, doped zinc oxide or indium tin oxide. Suitable dopants are, for example, aluminum or gallium.

In at least one further embodiment according to the first and/or second aspect, the auxiliary layer has zinc oxide or consists thereof. The semiconductor layer sequence is based on gallium nitride (GaN). In an advantageous manner, zinc oxide behaves intrinsically as an n-semiconductor. Surprisingly, it has been found that this has a selectively good electrical contact with an n-conducting second semiconductor layer based on gallium nitride (n-GaN for short), and forms a diode in reverse direction during operation of the semiconductor chip with respect to a p-conducting first semiconductor layer based on gallium nitride (p-GaN for short). A contact resistance between the auxiliary layer and the second semiconductor layer can in this case be, for example, at least $5*10^{-6}$ $\Omega*cm^2$ and at most $5*10^{-5}$ $\Omega*cm^2$. A contact resistance between the auxiliary layer and the second semiconductor layer can furthermore be at least $5*10^{-5}$ $\Omega*cm^2$.

In at least one further embodiment according to the first and/or second aspect, the auxiliary layer comprises a gold-germanium alloy. The semiconductor layer sequence is based on aluminum gallium indium phosphide (InGaAlP). Surprisingly, it has been shown in a similar manner to the previous embodiment that the gold-germanium alloy is particularly suitable as a selective electrical contact for semiconductor layers based on InGaAlP. Furthermore, such an alloy can be reflective and semi-transparent in the case of a correspondingly low layer thickness. A contact resistance between the auxiliary layer and the second semiconductor layer can in this case be, for example, at least $1*10^{-5}$ $\Omega*cm^2$ and at most $1*10^{-4}$ $\Omega*cm^2$. A contact resistance between the auxiliary layer and the second semiconductor layer can also be at least $1*10^{-4}$ $\Omega*cm^2$.

In at least one further embodiment according to the first and/or second aspect, a further mirror layer is applied on a side of the auxiliary layer facing away from the semiconductor layer sequence. The further mirror layer can in particular be a metallic mirror layer. For example, the further mirror layer is made from silver, aluminum, rhodium or gold. A layer thickness of the further mirror layer can be more than 100 nm by way of example. In an advantageous manner, the respective recess can be mirror-coated by means of the further mirror layer.

In at least one further embodiment according to the first and/or second aspect, the auxiliary layer is at least partially in direct contact with the second semiconductor layer after application to the side surfaces exposed by the respective recess. As a result, in particular a contact area between the auxiliary layer and the second semiconductor layer is enlarged, namely around the side surfaces of the second semiconductor layer. An increase in efficiency of the semiconductor chip can thus be achieved in an advantageous manner. In this context, both a reduction of the threshold voltage and an increase in brightness by reducing the current density are conceivable (so-called 'droop effect').

In at least one further embodiment according to the first and/or second aspect, the auxiliary layer is applied at least partially on a side of the first semiconductor layer facing away from the second semiconductor layer. The auxiliary layer contacts the first semiconductor layer directly at least in a region around the respective recess. As a result, in particular a contact area between the auxiliary layer and the first semiconductor layer is enlarged. In an advantageous manner, a further increase in the ESD strength of the semiconductor chip can thus be achieved.

In at least one further embodiment according to the first and/or second aspect, a metallic mirror layer is applied to the side of the first semiconductor layer facing away from the second semiconductor layer before the respective recess is formed in the semiconductor layer sequence. Corresponding to a region of the respective recess, the metallic mirror layer has an opening in each case towards the semiconductor layer sequence. A passivation layer is applied to a side of the metallic mirror layer facing away from the semiconductor layer sequence.

In this context, the metallic mirror layer is formed, for example, only outside a first lateral region around the respective recess, that is to say at a distance therefrom. For example, before the step or in the step of forming the respective recess, the passivation layer is removed in a second lateral region around the respective recess. In this case, fluorine-containing plasma can be used, for example. In this case, the second lateral region is, for example, smaller than the first lateral region or is set back with respect to the respective recess in that a side surface of the metallic mirror layer is completely covered by the passivation layer even after the step of forming the respective recess, so that a short circuit between the subsequently applied auxiliary layer and the metallic mirror layer can be avoided. For example, a lateral distance between the metallic mirror layer and the subsequently applied auxiliary layer is between at least wo nm and at most 5 μm, in particular less than 10 μm.

In at least one further embodiment according to the first and/or second aspect, the passivation layer is removed in a lateral region around the respective recess.

For example, a wet chemical etching medium is used for this purpose. The lateral region around the respective recess, in which the passivation layer is removed, is also referred to below as the third lateral region. In particular, the second lateral region comprises the third lateral region, which in turn comprises the first lateral region. In other words, a side surface of the metallic mirror layer can thus also be completely covered by the passivation layer after this step. In particular, the side of the first semiconductor layer facing away from the second semiconductor layer is exposed at least between the first and the third region around the respective recess, so that the subsequently applied auxiliary layer has an enlarged contact area to the first semiconductor layer. This advantageously contributes to a particularly high ESD strength of the semiconductor chip. A lateral extent of the region from which the passivation layer has been removed is, for example, between at least 500 nm and at most 5000 nm.

In at least one further embodiment according to the first and/or second aspect, a mirror protection layer is applied to the side of the first semiconductor layer facing away from the second semiconductor layer before the auxiliary layer is applied. The mirror protection layer completely covers side surfaces of the metallic mirror layer facing the respective recess.

In particular, the mirror protection layer can also partially or completely cover a side surface of the passivation layer facing the respective recess. The mirror protection layer contributes in particular to the fact that the metallic mirror layer is protected in the step of forming the respective recess, for example, in the case of semiconductor etching by means of etching media such as chlorine-containing plasma. The mirror protection layer can be arranged on the side surfaces of the metallic mirror layer in a self-aligning manner, for example. Such a self-aligning mirror protection layer is described, for example, in DE 10 2012 107 921 A1, which is hereby expressly incorporated by reference.

In at least one further embodiment according to the first and/or second aspect, in at least one of the steps of forming the respective recess, the application of the auxiliary layer or an intermediate step thereof, a modified region of the semiconductor layer sequence is formed around the uncovered side surfaces of the first semiconductor layer and the second semiconductor layer. The modified region impairs electrical conductivity between the auxiliary layer and the first semiconductor layer.

The modified region is in particular a surface modification, for example, a modification which only relates to an extremely small proportion of the semiconductor layer sequence with respect to its main extension direction. The modification can be, for example, a reaction which is carried out by supplying a gas during and/or between and/or after one of the aforementioned steps. By way of example, a gas such as, for example, oxygen is supplied in a process step after the semiconductor etching so that the GaN semiconductor material is exposed to $O_2$ plasma on its surface. In this region, the semiconductor material, in particular a p-conducting region, can be partially damaged, destroyed or deactivated, by way of example by oxidation, such that, for example, a breakdown voltage and/or an operation voltage towards the subsequently applied auxiliary layer is raised. Alternatively, for example, use of fluorine or hydrogen is conceivable, so that the surface is exposed to F plasma or H plasma. Furthermore, the modification can also be effected by mechanical action, for example, by argon sputtering.

The modification relates in particular to both the first semiconductor layer and the second semiconductor layer. In an advantageous manner, the modification further restricts an electrical conductivity between the auxiliary layer and the sensitive first semiconductor layer, while the substantially insensitive second semiconductor layer undergoes virtually no impairment of electrical conductivity. Such a method step can be carried out in a particularly low-cost manner.

The modified region can extend into the semiconductor layer sequence with a depth of between at least 1 nm and at most 100 nm, for example, between at least 10 nm and at most 50 nm, in particular between at least 10 nm and at most 20 nm. A volume fraction of the modified region with respect to the semiconductor layer sequence is thus negligible, and in particular, substantially less than 1%, for example, in the range of 0.1%.

In at least one further embodiment according to the first and/or second aspect, the semiconductor layer sequence is reverse-doped in the region of the uncovered side surfaces of the first semiconductor layer and of the second semiconductor layer. For example, components of the subsequently applied auxiliary layer, which at least partially covers the uncovered side surfaces of the semiconductor layer sequence, diffuse into the adjoining semiconductor regions, as a result of which the semiconductor properties thereof can be greatly altered in particular with regard to respective transition resistances. For such a reverse-doping, for example, the aforementioned gold-germanium alloy is particularly suitable as a material of the auxiliary layer.

In at least one further embodiment according to the first and/or second aspect, the modified region of the semiconductor layer sequence is at least partially removed. For example, the modified region is removed at least partially by selective wet-chemical etching, for example, by means of hot phosphoric acid ($H_3PO_4$) or potassium hydroxide (KOH). This advantageously contributes to a high ESD strength of the semiconductor chip.

In at least one further embodiment according to the first and/or second aspect, prior to the formation of the respective recess, in particular before the metallic mirror layer is applied, a contact layer is applied to the side of the first semiconductor layer facing away from the second semiconductor layer. The contact layer serves, for example, for current spreading. This is particularly advantageous when a dielectric mirror is subsequently applied prior to the metallic mirror layer. The contact layer is, for example, of a transparent conductive oxide (TCO).

In at least one further embodiment according to the first and/or second aspect, the contact layer which is applied before the formation of the respective recess on the side of the first semiconductor layer facing away from the second semiconductor layer is completely removed in a lateral fourth region around the respective recess. For example, after the application of the auxiliary layer, the contact layer in this region is removed with a selective, wet-chemical etching step so that an edge of the contact layer facing the respective recess is pulled behind a side surface of the passivation layer facing the recess. The edge of the contact layer is advantageously covered by the passivation layer such that short circuits with the auxiliary layer can be avoided.

In at least one further embodiment according to the first and/or second aspect, an active region in the semiconductor layer sequence is penetrated in the step of forming the respective recess. The active region is configured in particular for receiving or generating electromagnetic radiation. The active region can be, for example, a radiation-generating pn-junction or a single or multiple quantum structure. Furthermore, side surfaces of the active region are exposed in this step. After being applied to the side surfaces exposed by the respective recess, the auxiliary layer is at least partially in direct contact with the active region.

In at least one further embodiment according to the first and/or second aspect, in the step of forming the respective recess, a semiconductor buffer region is exposed on a side of the first semiconductor layer which faces away from the metallic mirror layer. After application, the auxiliary layer is at least partially in direct contact with the semiconductor buffer region.

The semiconductor buffer region can in particular comprise the aforementioned electrical contacts, contact layers or contact layer sequences via which the respective electrical contacting of the second semiconductor layer is achieved. For example, the semiconductor buffer region comprises a current spreading layer, the side surfaces and/or surface of which are exposed by the respective recess, so that an indirect electrical contacting of the second semiconductor layer is made possible by means of the auxiliary layer.

In particular, in the step of forming the respective recess, a current spreading layer is exposed on a side of the first semiconductor layer facing away from the metallic mirror layer so that the auxiliary layer, after application, is at least partially in direct contact with the current spreading layer. The above-mentioned contact resistance between the auxiliary layer and the second semiconductor layer can in particular result from the contacting via the current spreading layer.

In at least one further embodiment according to the first and/or second aspect, the semiconductor chip is designed as an optoelectronic semiconductor chip. The optoelectronic semiconductor chip can be, for example, a radiation-receiving semiconductor chip such as a photodiode or a solar cell.

In particular, the optoelectronic semiconductor chip is a light-emitting semiconductor chip such as a light-emitting diode chip.

BRIEF DESCRIPTION OF THE DRAWINGS

Further features, refinements and expediencies emerge from the following description of the exemplary embodiments in conjunction with the figures.

In the figures:

FIG. 4 shows a second section of the semiconductor chip produced according to FIGS. 1a to 1f in a schematic sectional view;

DETAILED DESCRIPTION OF ILLUSTRATIVE EMBODIMENTS

Identical, similar or identically acting elements are provided with the same reference signs in the figures. The figures and the size ratios of the elements illustrated in the figures among one another are not to be regarded as being to scale. Rather, individual elements can be represented with an exaggerated size for better representability and/or for better understanding.

The figures show, in particular, sections of a part of a semiconductor chip to be produced. The cut-outs can in each case be continued correspondingly on the right and the left side of the sectional representation, as indicated by dash-dot lines.

In conjunction with the schematic sectional representations of FIGS. 1a to 1f, an exemplary embodiment of a method for producing a semiconductor chip described here is explained in more detail. The semiconductor chip described here is in particular an optoelectronic semiconductor chip such as an LED chip, by way of example an InGaN LED chip. In other exemplary embodiments, the semiconductor chip can also be an InGaAlP LED chip by way of example.

Figure 1A:
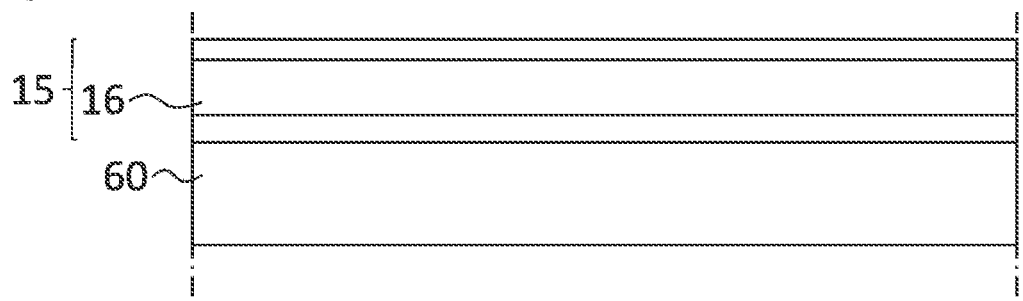
FIGS. 1a to 1f show an exemplary embodiment of a method for producing a semiconductor chip using intermediate steps in each case illustrated in a schematic sectional view.

FIG. 1a shows a first method step in which a semiconductor buffer region 15 is deposited on an upper side of a growth substrate 60. For example, the growth substrate 60 is a sapphire substrate or a silicon substrate onto which a semiconductor layer sequence 10 can subsequently be deposited (see FIG. 1b). The semiconductor layer sequence 10 is based, for example, on a nitride compound semiconductor material. For example, the semiconductor buffer region 15 is a layer which is formed with GaN.

Figure 1B:
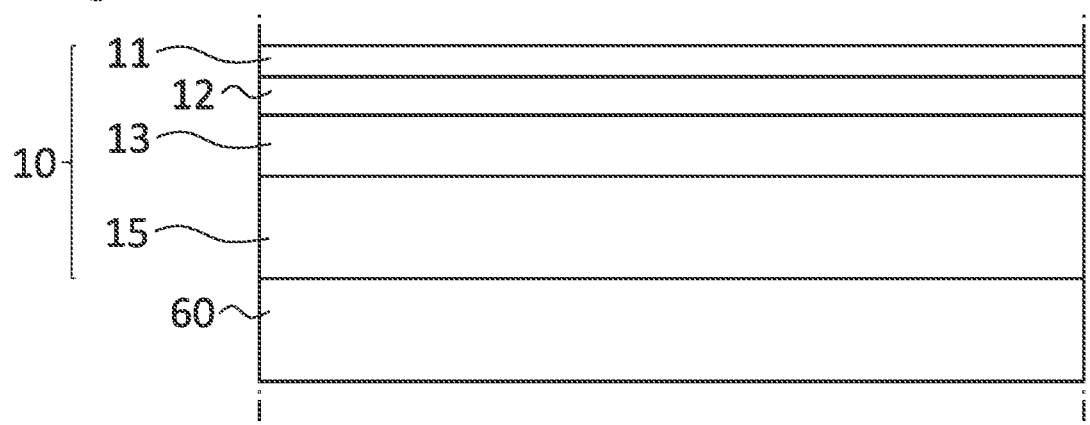

Subsequently, see FIG. 1b, a first semiconductor layer 11, an active region 12 and a second semiconductor layer 13 are deposited epitaxially. These layers are, for example, likewise layers formed with GaN. In particular, the first semiconductor layer 11 is a p-doped region and the second semiconductor layer 13 is an n-doped region. If the semiconductor chip is, for example, a radiation-generating semiconductor chip, in the finished semiconductor chip 1 (see, e.g., FIG. 2) electromagnetic radiation is generated in the active region 12.

The semiconductor buffer region 15 can have a current spreading layer 16 (see, e.g., FIG. 1a) which extends, for example, areally through the semiconductor buffer region 15. For the sake of clearness, the current spreading layer 16 is illustrated only in FIGS. 1a and 1e.

Subsequently, see FIG. 1c, a metallic mirror layer 30 is applied in a structured manner on the top side of the semiconductor layer sequence 10 facing away from the growth substrate 60. For example, the metallic mirror layer 30 is a silver mirror which can have a thickness of at least 100 nm and at most 200 nm, for example. For example, the metallic mirror layer is first applied by vapor deposition or sputtering and is then structured, such as, for example, with the aid of a photostructurable protective layer and exposure.

After this step, the metallic mirror layer 30 is structured in particular in such a way that it is completely opened in the lateral direction. In other words, the metallic mirror layer 30 has at least one opening 30a.

Subsequently, a passivation layer 40 is applied to a side of the metallic mirror layer 30 facing away from the semiconductor layer sequence 10. The passivation layer 40 is, for example, a layer having silicon dioxide or silicon nitride; for example, a thickness of the passivation layer 40 is at least 50 nm and at most 1000 nm, in particular between 100 nm and 500 nm.

Figure 1C:
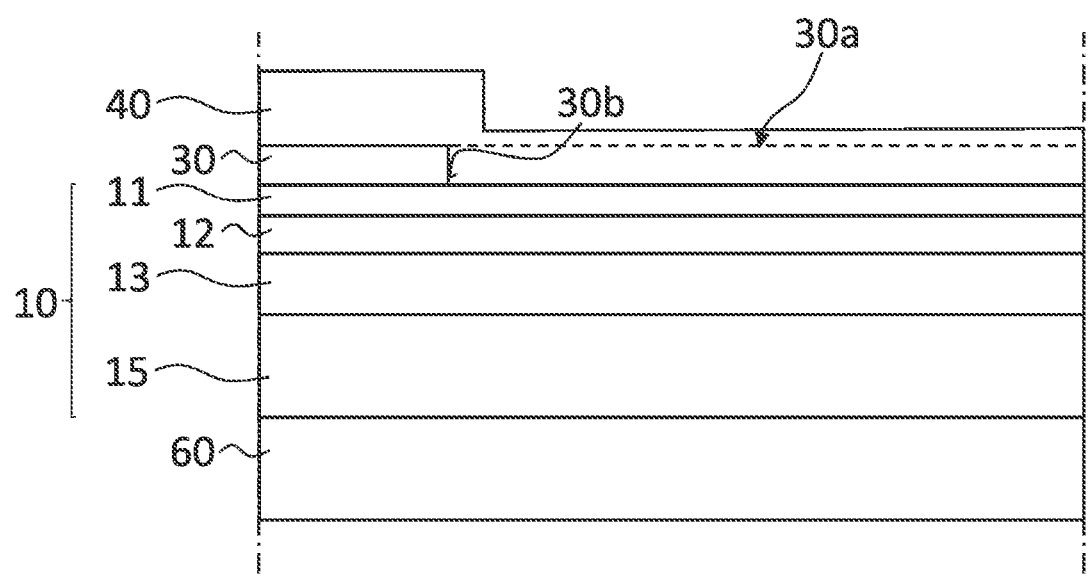

As indicated in FIG. 1c, the passivation layer 40 can extend areally over the metallic mirror layer 30. In the region of the respective opening 30a, the passivation layer 40 can also be in direct contact with the semiconductor layer sequence 10. In particular, a side surface 30b of the metallic mirror layer 30 exposed by the respective opening 30a is covered by the passivation layer 40.

Figure 1D:
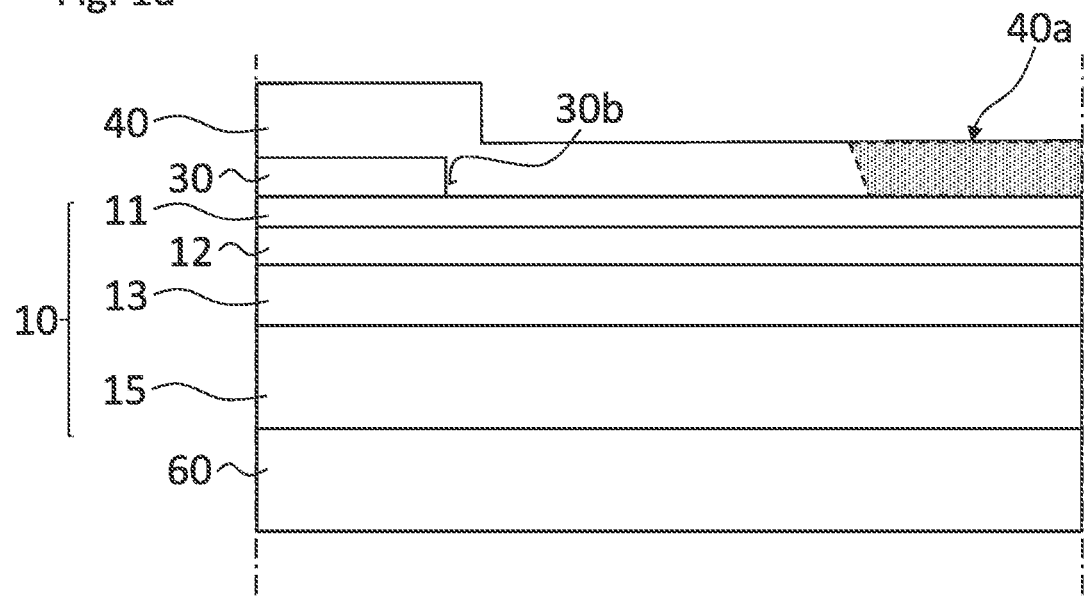

Subsequently, see FIG. 1d, corresponding to the respective opening 30a in the metallic mirror layer 30, openings 40a are produced in the passivation layer 40, for example, by means of a photomask and fluorine-containing plasma. The respective opening 40a in the passivation layer 40 is advantageously arranged in such a way that the side surface 30b of the metallic mirror layer 30 is still covered by the passivation layer 40.

Subsequently, see FIG. 1e, a dry etching step is carried out, for example, using chlorine plasma, in which the material of the semiconductor layer sequence 10 is at least partially removed so that a recess 10a is formed in the semiconductor layer sequence 10. In the region of the recess 10a, the side surfaces 11b, 12b, 13b of the first semiconductor layer 11, of the active region 12 and of the second semiconductor layer 13 are exposed. Furthermore, it is conceivable that a side surface 15b of the semiconductor buffer region 15 is exposed through the recess 10a. In other words, the recess 10a extends in the vertical direction into the semiconductor buffer 15 region, in particular up to the current spreading layer 16.

The side surface 30b of the metallic mirror layer 30, on the other hand, can still be covered by the passivation layer 40. The recess 10a can be, for example, a circular recess or a grid structure. The semiconductor layer sequence 10 can have a steep, exposed edge, which has, for example, an angle of more than 75° with respect to the growth substrate 60.

In a further method step, which is explained in conjunction with FIG. 1f, an auxiliary layer 20 is subsequently applied to the exposed semiconductor layer sequence 10, for example, by means of homogeneous sputtering. For example, the auxiliary layer 20 is a zinc oxide layer. The auxiliary layer can in particular have a thickness of at least 5 nm and at most 50 nm.

Figure 1E:
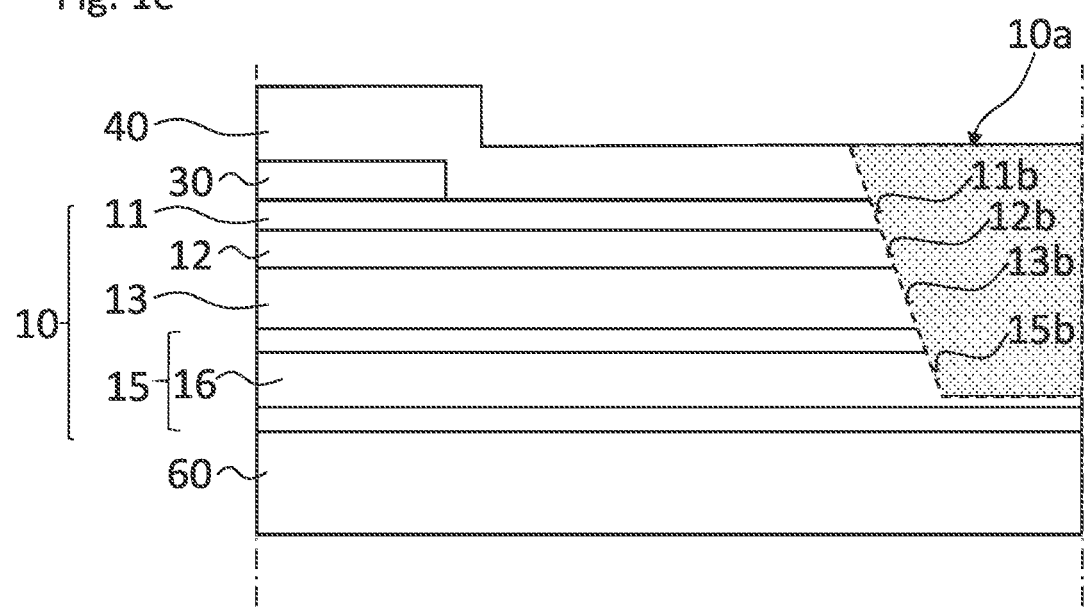
Figure 1F:
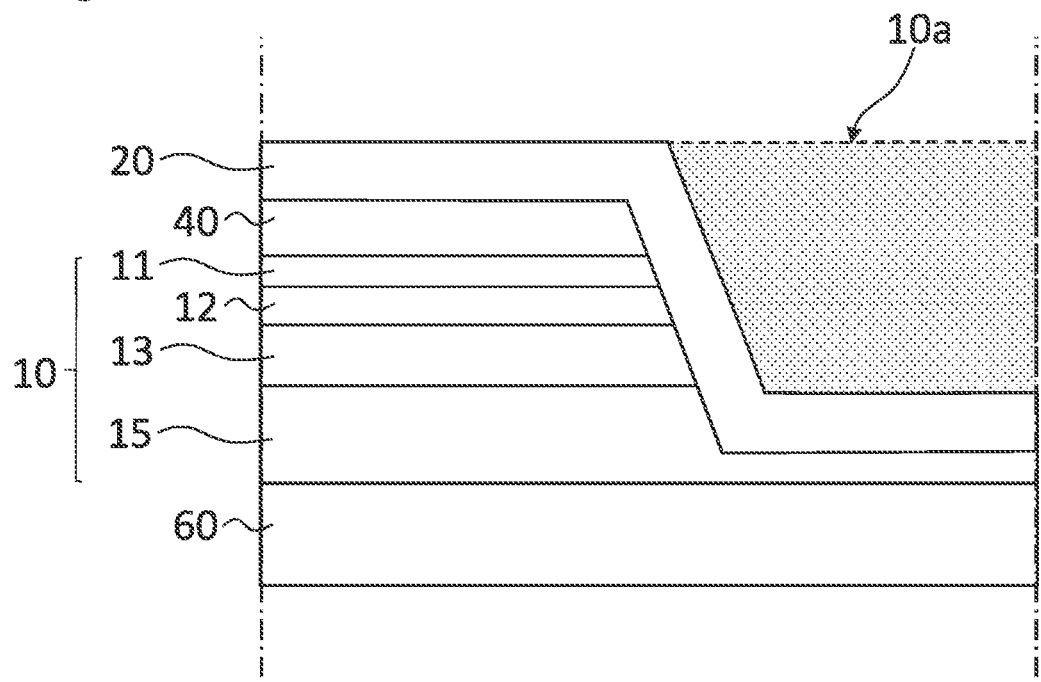

Thus, in particular, no intermediate step is carried out between the method steps illustrated in FIG. 1e and FIG. 1f, in which a dielectric, for example, TEOS-SiO$_2$, is deposited and anisotropically etched back.

In other words, the auxiliary layer 20 is applied directly to the semiconductor layer sequence 10 so that it is at least in direct contact with the first semiconductor layer 11 at the side surface 11b.

The auxiliary layer represents, in particular, a contact material which selectively only forms a good contact with the n-GaN blocking diode or a high transition resistance to the p-GaN when the semiconductor chip is operated. In this case, zinc oxide is particularly suitable since it already behaves intrinsically as an n-semiconductor. Alternatively, an extrinsic doped semiconductor material such as doped amorphous silicon can also be used, for example, doped with aluminum, or also gallium-doped zinc oxide or indium tin oxide can be used. Furthermore, metals such as aluminum or rhodium can also be used, which form a blocking Schottky diode with the p-GaN. The auxiliary layer 20 can also consist of or have a plurality of said materials, for example, in the form of a contact stack.

In an advantageous manner, an increase in efficiency can be achieved by means of the auxiliary layer 20, since a contact area to the second semiconductor layer 13 is enlarged by the side surface 13b so that the operating voltage can be reduced or the current density can be reduced. By removing the additional dielectric, a simplified process flow is made possible so that the semiconductor chip can be produced cost-effectively.

In subsequent method steps, a further mirror layer 25 (see, e.g., FIG. 5) can be applied on a side of the auxiliary layer 20 facing away from the growth substrate 60 so that the respective recess 10a is reflective. The mirror layer can in particular be a metallic mirror layer made of silver, aluminum, rhodium or gold. The mirror layer can have a thickness of at least boo nm, for example.

Furthermore, in subsequent method steps, for example, an electrically conductive material 70 can be filled into the opening 23, which electrically contacts the semiconductor material of the semiconductor buffer region 15 and/or the auxiliary layer 20. Furthermore, a carrier 80 can be applied and the growth substrate 60 can be removed, wherein the upper side of the semiconductor buffer region 15 facing away from the carrier 80 can be roughened, see FIG. 2.

Figure 2:
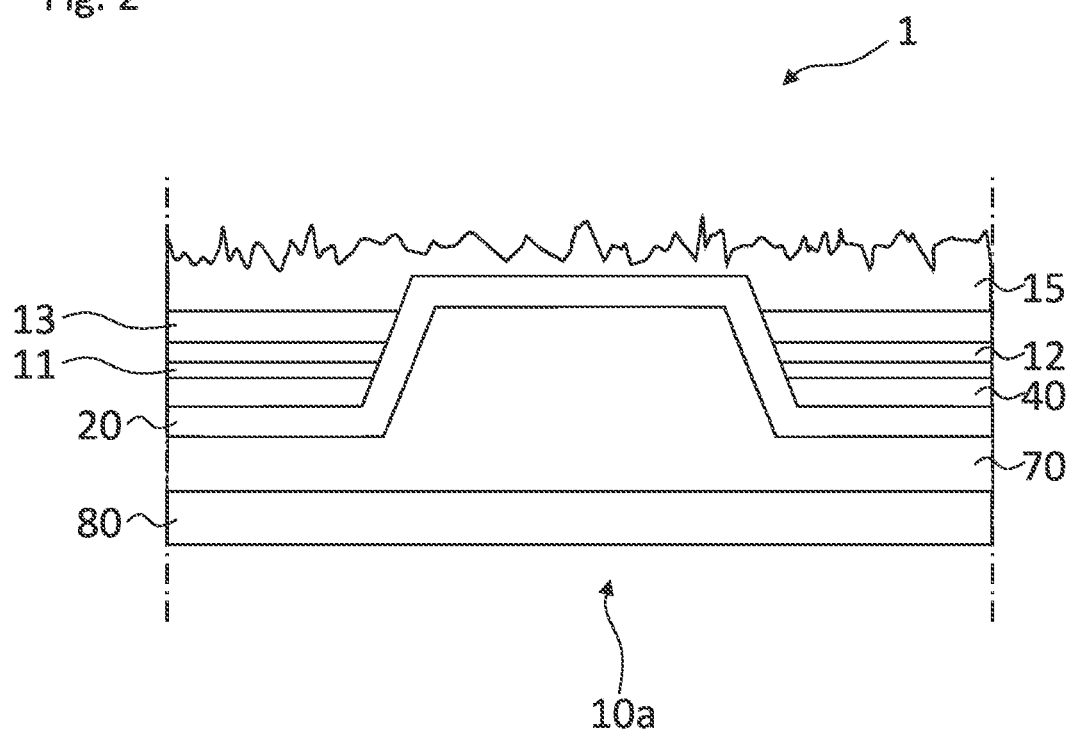
FIG. 2 shows a first section of the semiconductor chip produced according to FIGS. 1a to 1f in a schematic sectional view.

The first section of the completed semiconductor chip 1 illustrated in FIG. 2, in particular, shows a through-connection of the second semiconductor layer 13 via the auxiliary layer 20 from a side facing the first semiconductor layer 11, in which the recess 10a can be of circular design. A contacting of the first semiconductor layer 11 is not illustrated in any more detail here.

FIGS. 3a to 3g show first to seventh exemplary embodiments of a semiconductor chip produced according to FIGS. 1a to 1f in each case in a schematic sectional view.

In the semiconductor chip according to the first exemplary embodiment (FIG. 3a), the auxiliary layer 20 is arranged over the respective side surfaces 11b, 12b, 13b in direct contact with the first semiconductor layer 11, the active region 12 and the second semiconductor layer 13.

Compared to a GaN semiconductor layer sequence which is contacted with conventional contact material, that is to say, for example, by means of a silver or a platinum contact material (stack) coming from a p-conducting region, and by zinc oxide coming from an n-conducting region, an identical semiconductor layer sequence which is contacted on both sides by zinc oxide has greatly altered characteristics. If these semiconductor layer sequences are, for example, a GaN LED having a lateral extension area of 1000×1000 μm$^2$, which is areally contacted, thus, an operating current in the case of conventional contact material can be, for example, between 35 mA and 1750 mA, whereas if contact is made on both sides by zinc oxide, only an operating current of less than 1 mA to 10 mA occurs. In the first case, a nominal operating voltage is between 2.8 v and 3.3 v; in the second case, in contrast, the nominal operating voltage is increased by approximately 0.5 V to 1.0 V, for example, to between 3.5 V and 4.0 V.

In other words, the necessary operation (use) voltage is increased drastically. At operation (use) voltages of 2.7 V and 3.5 V, as are usual in the first case, in the second case therefore only a current flows which is substantially smaller.

Furthermore, a ratio of contact areas to the auxiliary layer 20 between the first and second semiconductor layers 11, 13 and further surfaces exposed by the respective recess, such as, for example, the current spreading layer 16, as shown in the general part of the description, is at least less than 1:3, a current flow between the auxiliary layer 20 and the first semiconductor layer is further reduced and is negligible in particular in the operating direction. In particular, in this case, a large ratio of a part of the current spreading layer 16 which forms the bottom surface of the respective recess 10a together with a surface formed by the respective recess 10a of the current spreading layer 16 to the exposed side faces 11b, 12b is advantageous.

The second exemplary embodiment (FIG. 3b) differs from the first exemplary embodiment in that an additional removal of the passivation layer is carried out after the semiconductor etching, for example, using a wet-chemical etching medium. Thus, a part bid of a surface of the first semiconductor layer 11 is also exposed. In an advantageous manner, a larger p-GaN area is thus available for forming a diode poled in reverse direction to the semiconductor chip, so that an ESD stability of the semiconductor chip is achieved.

Figure 3A:
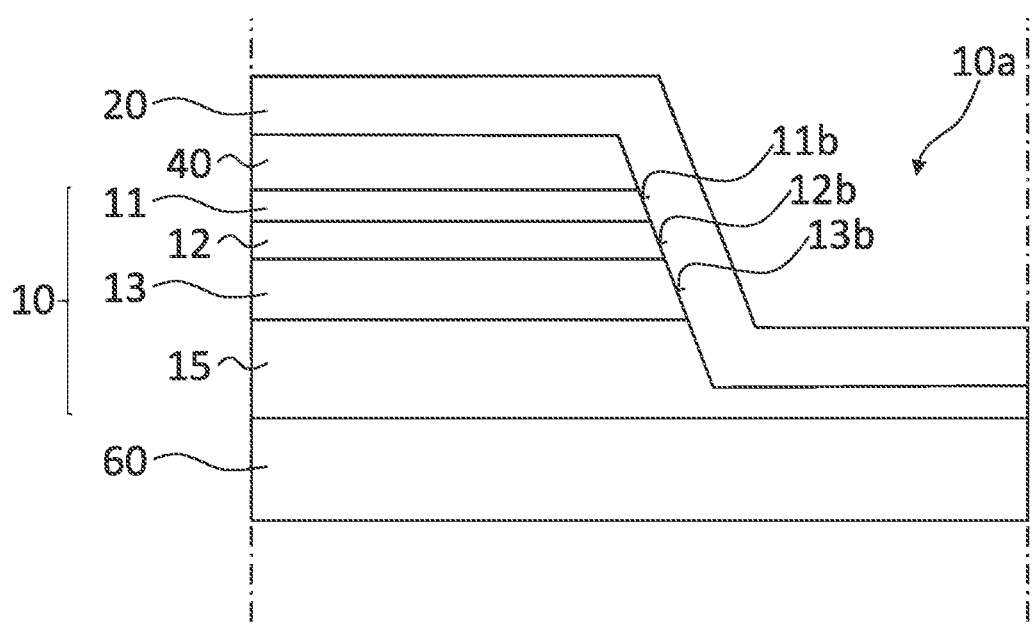
FIGS. 3a to 3g show a first to seventh exemplary embodiment of the semiconductor chip produced according to FIGS. 1a to 1f in a schematic sectional view.
Figure 3B:
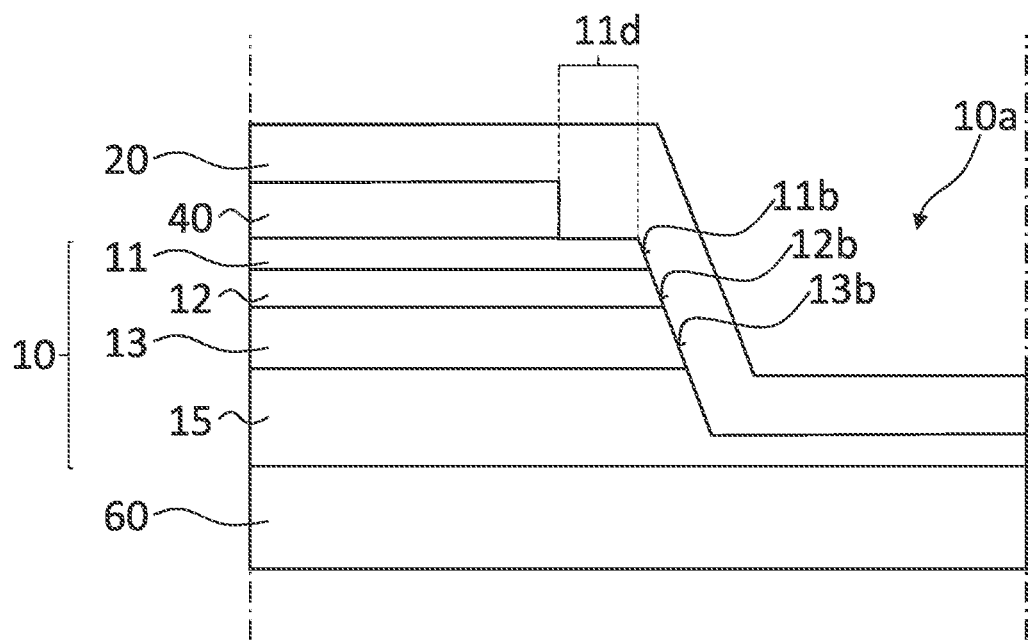
Figure 3C:
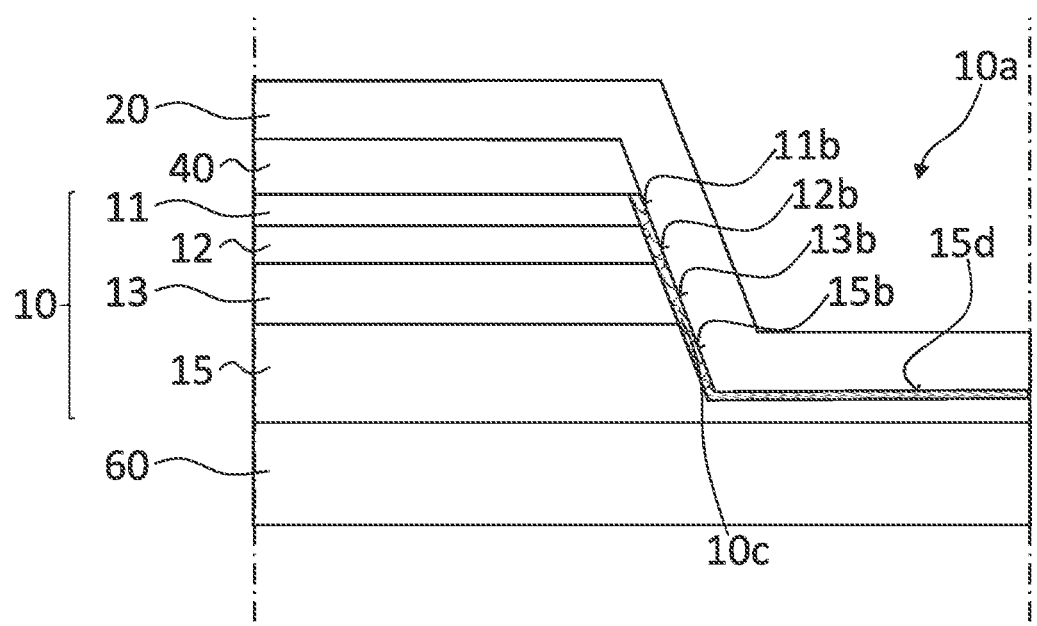
Figure 3D:
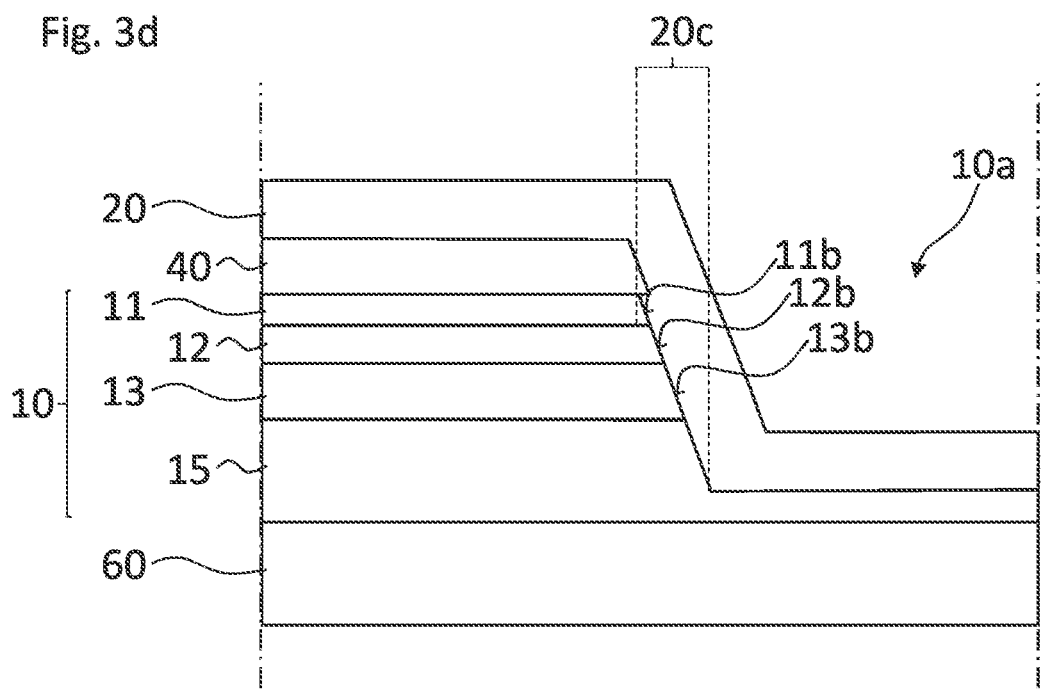
Figure 3E:
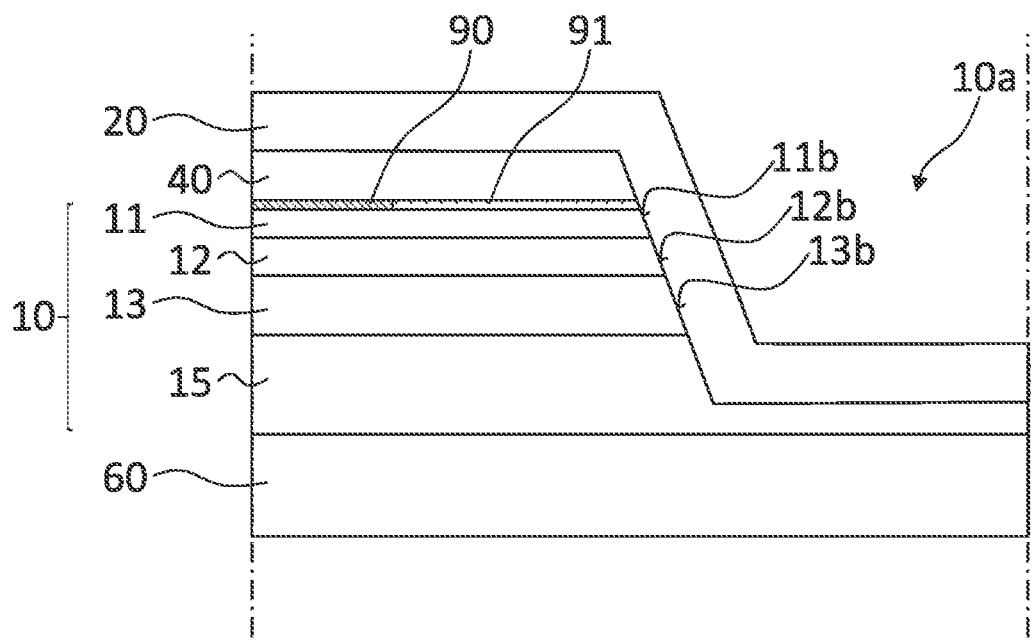

The third exemplary embodiment (FIG. 3c) differs from the previous exemplary embodiments in that a surface modification of the semiconductor layer sequence 10 is carried out after and/or during the semiconductor etching, related both to p-GaN and n-GaN. In particular, the latter can also relate to a pn-junction with the active region 12. As illustrated in FIG. 3c, a modified region 10c is thereby formed on the side surfaces 11b, 12b, 13b of the semiconductor layer sequence 10, for example, by supplying oxygen, fluorine or hydrogen (O$_2$ plasma, F plasma or H plasma), or by sputtering of argon.

The fourth exemplary embodiment (FIG. 3d) differs from the third exemplary embodiment in that the modified region 10c (see FIG. 3c) is removed partially or completely before the deposition of the auxiliary layer 20, for example, by means of selective wet-chemical etching, for example, by means of hot H$_3$PO$_4$ or KOH. The ESD stability of the semiconductor chip is advantageously improved in this way. For example, the subsequently applied auxiliary layer 20 extends into the removed region 10c. In particular, the latter can be completely filled by material 20c of the auxiliary layer 20.

The fifth exemplary embodiment (FIG. 3e) differs from the previous exemplary embodiments in that a thin current spreading layer 90 is arranged between the first semiconductor layer 11 and the passivation layer 40. For example, the current spreading layer 90 can also be a layer stack which is deposited in a plurality of coating processes. The current spreading layer 90 is applied in particular areally over the surface of the semiconductor layer sequence 10, for example, directly on the first semiconductor layer 11.

The current spreading layer 90 can in particular be transparent. By way of example, it is formed from a transparent conductive oxide such as indium tin oxide. The current spreading layer is particularly advantageous if a dielectric mirror is to be implemented prior to the metallic mirror layer.

In a subsequent step, for example, after the semiconductor etching, an edge of the current spreading layer 90 facing the recess 10a can be pulled in the lateral direction behind an edge of the passivation layer which faces the recess boa, in the lateral direction by way of example by about 1 µm. For example, a selective wet-chemical etching step is used for this purpose, in which material 91 of the current spreading layer 90 is completely removed. In an advantageous manner, short circuits with the auxiliary layer 20 can thus be avoided.

The sixth exemplary embodiment (FIG. 3f) differs from the previous exemplary embodiments in that the metallic mirror layer 30 is delimited by a mirror protection layer 50 towards the recess 10a. The mirror protection layer 50 can, for example, be applied in a self-adjusting manner, as already mentioned in the general description part. In this context, it is not necessary for the passivation layer 40 to cover the side surface 30b of the metallic mirror layer 30 (see, e.g., FIG. 1d); rather, the opening 40a can extend into the passivation layer 40 up to the side surface 30b.

Figure 3F:
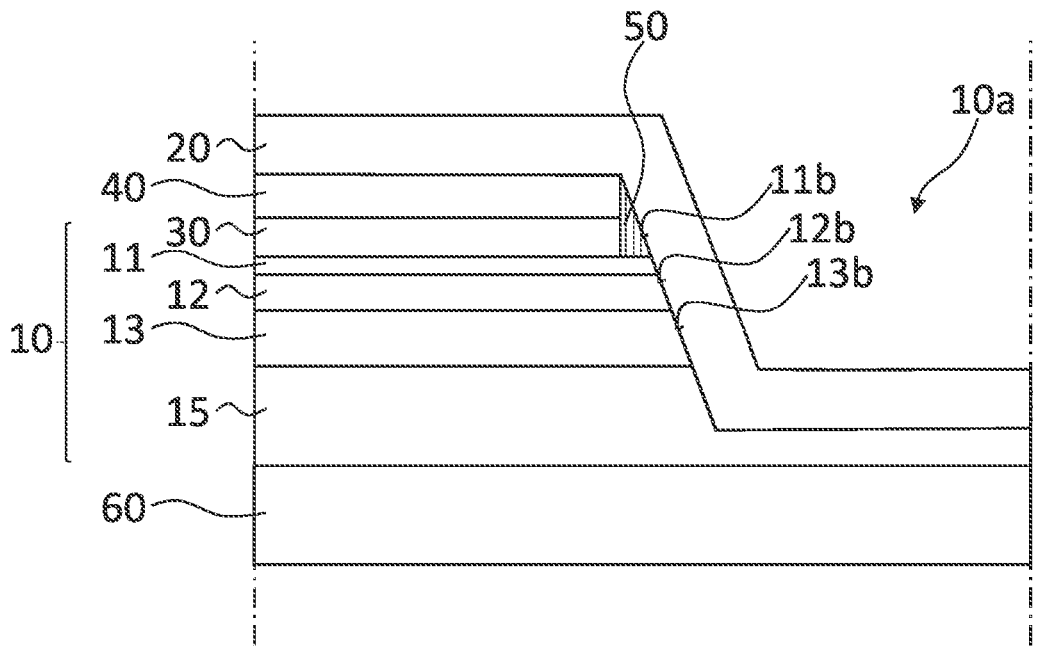
Figure 3G:
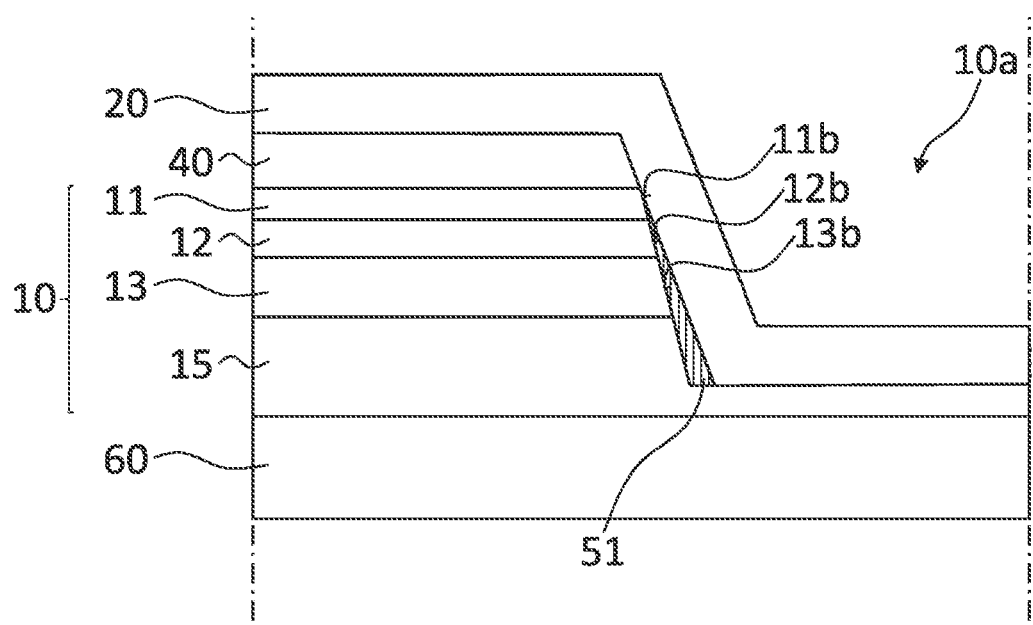

As illustrated in FIG. 3f, very small lateral projections of the active region 12 beyond the metallic mirror layer 30 can thus be achieved. In this way, a region of the active region which cannot be used for generating radiation or radiation detection is kept very small. In this context, the metallic mirror layer 30 can cover up to 90% of an area of the active region 12.

The seventh exemplary embodiment (FIG. 3g) differs from the previous exemplary embodiments in that, before the application of the auxiliary layer 20, a protective layer 51 is applied to the side surfaces 11b, 12b, 13b of the semiconductor layer sequence 10 so that these side surfaces are covered at least in places. For example, conformal deposition is used here. The protective layer 51 has as a material, for example, oxides or nitrides such as silicon dioxide, $Si_3N_4$ and/or $Al_2O_3$ or a material stack thereof. In a subsequent method step, the protective layer 51 is etched back in a directed manner so that at least the side surface 11b of the first semiconductor layer 11 is exposed. Measurements have shown that a semiconductor chip produced in this way surprisingly has a low-current behavior, a high-current behavior and a breakthrough behavior in reverse direction equivalent to a semiconductor chip in which the protective layer 51 has not been etched back or has been etched back only slightly so that the side surfaces 11b, 12b, 13b of the semiconductor layer sequence 10 are furthermore covered by the protective layer 51.

The second section of the semiconductor chip illustrated in FIG. 4 shows the laterally drawn back passivation layer 40 explained in connection with the second exemplary embodiment (see, e.g., 3b). A diode 21 (likewise schematically illustrated) formed between the auxiliary layer 20 and the first semiconductor layer 11 is polarized in reverse direction with respect to a light-emitting diode (schematically illustrated in the operating direction) formed by the semiconductor chip. As is further illustrated in FIG. 4, the section of the first semiconductor layer 11 which is in direct contact with the auxiliary layer 20 has a lateral distance towards the metallic mirror layer 30 so that short circuits can be avoided. In this exemplary embodiment, the auxiliary layer 20 is arranged in an overlapping manner with respect to the metallic mirror layer 30 and is separated therefrom by the passivation layer 40. In particular, at least the part 11d of the first semiconductor layer 11 (see FIG. 3b) and the side surfaces 11b and 12b are reliably covered with the auxiliary layer 20. A lateral overlap region of the auxiliary layer 20 with the metallic mirror layer 30 can optionally be dispensed with.

Figure 5:
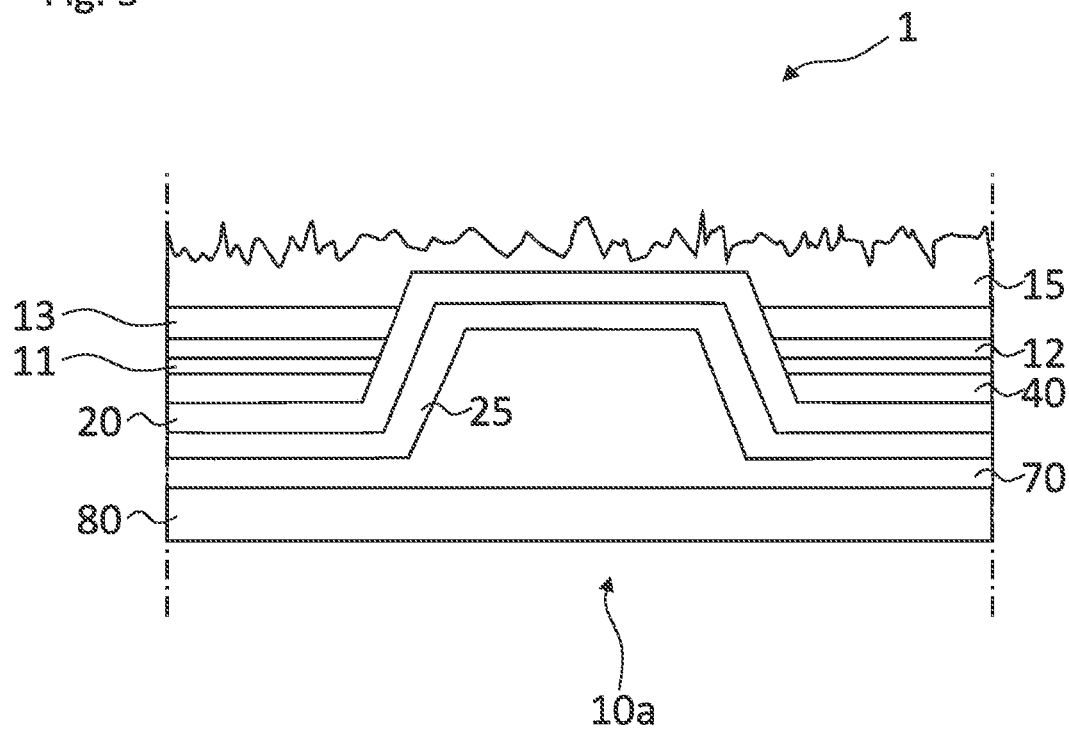
FIG. 5 shows an eighth exemplary embodiment of the semiconductor chip produced according to FIGS. 1a to 1f in a schematic sectional view.

FIG. 5 shows an eighth exemplary embodiment of the semiconductor chip produced according to FIG. 1a to 1f in a schematic sectional view. The illustrated section corresponds to the section shown in FIG. 2; in addition, however, the semiconductor chip 1 has a further mirror layer 25 which coats the respective recess 10a in a reflective manner. In an advantageous manner, the further mirror layer 25 extends in the lateral direction at least as far as the metallic mirror layer 30 so that complete mirroring can be achieved in the region of the respective recess 10a. In this context, it is also conceivable for the two mirror layers 25, 30 to be arranged so as to overlap in the lateral direction.

Figure 6:
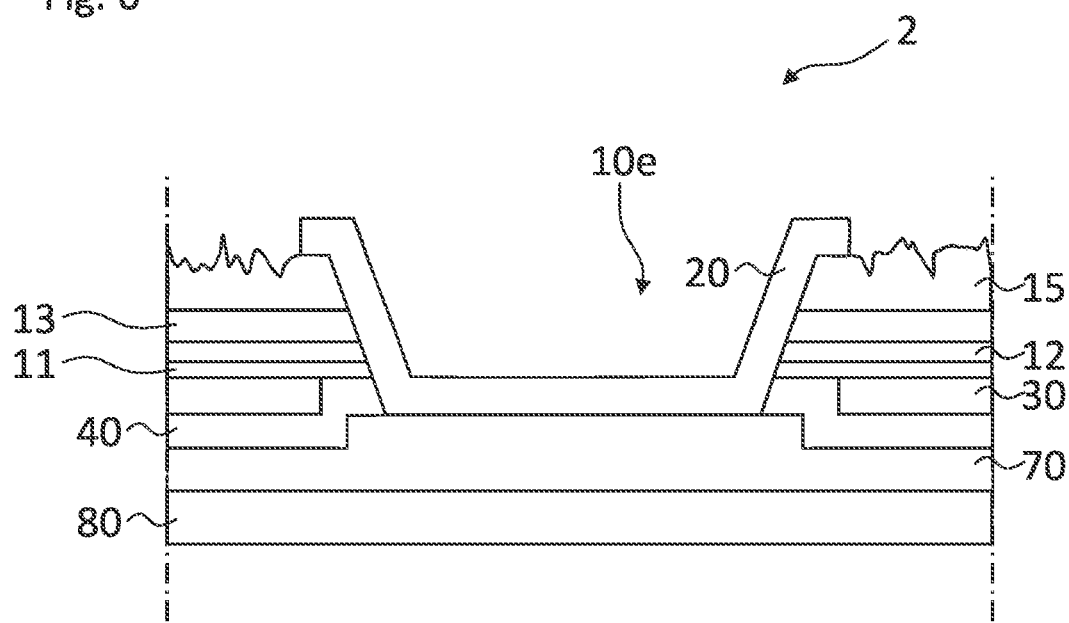
FIG. 6 shows a ninth exemplary embodiment of a further semiconductor chip in a schematic sectional view.

A ninth exemplary embodiment of a further semiconductor chip 2 is illustrated in a fragmentary manner in a schematic sectional view in FIG. 6. The fragment corresponds essentially to that of FIGS. 2 and 5; however, at least one recess 10e is formed into the semiconductor layer sequence 10 from a side of the second semiconductor layer 13 facing away from the first semiconductor layer 11. This exemplary embodiment in particular relates to a completely etched-through semiconductor stack in which the respective recess 10e extends completely through the semiconductor buffer region 15 up to the conductive layer 70. The side surfaces exposed by the respective recess 10e are covered by the auxiliary layer 20 analogously to the previous exemplary embodiments. The respective recess 10e can also be used as an n-side via, and the respective recess 10a (see, e.g., FIGS. 1-5) is referred to as p-side via.

The invention is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. A method for producing a semiconductor chip, the method comprising:
    providing a semiconductor layer sequence having a first semiconductor layer and a second semiconductor layer, wherein the first semiconductor layer is formed as a p-conducting semiconductor region and the second semiconductor layer is formed as an n-conducting semiconductor region, or vice versa;
    forming at least one recess in the semiconductor layer sequence so that side surfaces of the first and second semiconductor layers are exposed, wherein the recess is multiple times wider than deep; and
    applying an auxiliary layer for electrically contacting the second semiconductor layer, wherein the auxiliary layer at the side surfaces exposed by the recess is at least partially in direct contact with the first semiconductor layer and the auxiliary layer is applied at least partially to the side of the first semiconductor layer facing away from the second semiconductor layer, and wherein a contact resistance between the auxiliary layer and the first semiconductor layer is at least 10 times higher than a contact resistance between the auxiliary layer and the second semiconductor layer.

2. The method according to claim 1, wherein the auxiliary layer forms a diode with the first semiconductor layer.

3. The method according to claim 1, wherein the auxiliary layer comprises a transparent conductive oxide, a metal, or an extrinsic doped semiconductor material.

4. The method according to claim 1, wherein the auxiliary layer comprises zinc oxide, and wherein the semiconductor layer sequence is based on GaN.

5. The method according to claim 1, wherein the auxiliary layer comprises a gold-germanium alloy, and wherein the semiconductor layer sequence is based on InGaAlP.

6. The method according to claim 1, wherein the auxiliary layer is at least partially in direct contact with the second semiconductor layer.

7. The method according to claim 1, wherein the auxiliary layer directly contacts the first semiconductor layer at least in a region around the recess.

8. The method according to claim 1, further comprising:
applying a metallic mirror layer on the side of the first semiconductor layer facing away from the second semiconductor layer, the metallic mirror layer comprising an opening towards the semiconductor layer sequence corresponding to a region of the recess, and
applying a passivation layer to a side of the metallic mirror layer facing away from the semiconductor layer sequence,
wherein the metallic mirror layer and the passivation layer are applied before the recess is formed.

9. The method according to claim 8, further comprising removing the passivation layer in a lateral region around the recess.

10. The method according to claim 8, further comprising applying a mirror protective layer to the side of the first semiconductor layer facing away from the second semiconductor layer, wherein the mirror protective layer completely covers side surfaces of the metallic mirror layer facing the recess.

11. The method according to claim 1, further comprising forming a modified region of the semiconductor layer sequence around the exposed side surfaces of the first and second semiconductor layers, the modified region impairs an electrical conductivity between the auxiliary layer and the first semiconductor layer.

12. The method according to claim 11, further comprising at least partially removing the modified region of the semiconductor layer sequence.

13. The method according to claim 1, wherein forming the at least one recess in the semiconductor layer sequence comprises forming an active region in the semiconductor layer sequence and exposing side surfaces of the active region, and wherein, after applying the auxiliary layer, the auxiliary layer is at least partially in direct contact with the active region at the side surfaces exposed by the recess.

14. The method according to claim 1, wherein forming the at least one recess in the semiconductor layer sequence comprises exposing a semiconductor buffer region on a side of the first semiconductor layer facing away from a metallic mirror layer, and wherein, after applying the auxiliary layer, the auxiliary layer is at least partially in direct contact with the semiconductor buffer region.

15. The method according to claim 1, wherein the semiconductor chip is an optoelectronic semiconductor chip.

16. A semiconductor chip manufactured with the method of claim 1, the chip comprising:
the semiconductor layer sequence having the first semiconductor layer and the second semiconductor layer, wherein the first semiconductor layer is formed as a p-conducting semiconductor region and the second semiconductor layer is formed as an n-conducting semiconductor region, or vice versa;
the at least one recess in the semiconductor layer sequence so that the side surfaces of the first semiconductor layer and of the second semiconductor layer are exposed, wherein the recess is multiple times wider than deep; and
the auxiliary layer for electrically contacting the second semiconductor layer, wherein the auxiliary layer is located on the side surfaces exposed by the respective recess is at least partially in direct contact with the first semiconductor layer.

17. A method for producing a semiconductor chip, the method comprising:
providing a semiconductor layer sequence having a first semiconductor layer and a second semiconductor layer;
forming at least one recess in the semiconductor layer sequence so that side surfaces of the first semiconductor layer and of the second semiconductor layer are exposed; and
applying an auxiliary layer for electrically contacting the second semiconductor layer, wherein the auxiliary layer at the side surfaces exposed by the respective recess is at least partially in direct contact with the first semiconductor layer;
wherein the first semiconductor layer is formed as a first one of a p-conducting semiconductor region or an n-conducting semiconductor region, and wherein the second semiconductor layer is formed as a second one of the p-conducting semiconductor region or the n-conducting semiconductor region different from the first one of the p-conducting semiconductor region or the n-conducting semiconductor region;
wherein the recess is multiple times wider than deep;
wherein the auxiliary layer is at least partially in direct contact with the second semiconductor layer;
wherein a contact resistance between the first semiconductor layer and the auxiliary layer is at least more than $1*10^{-3}$ $\Omega cm^2$ and a contact resistance between the second semiconductor layer and the auxiliary layer is at most $1*10^{-4}$ $\Omega cm^2$;
wherein the semiconductor chip is an optoelectronic semiconductor chip having an active region formed between the first and the second semiconductor layer, wherein the active region is configured to generate electromagnetic radiation;
wherein the auxiliary layer comprises zinc oxide, and wherein the semiconductor layer sequence is based on gallium nitride (GaN);
wherein a layer thickness of the auxiliary layer is between at least 5 nm and 200 nm;
wherein the auxiliary layer is arranged over respective side surfaces of the recess in direct contact with the active region, and
wherein a metallic mirror layer is disposed directly on the auxiliary layer, on a side of the auxiliary layer facing away from the semiconductor layer sequence, so that the recess is reflective.

18. The method according to claim 17, wherein the recess is filled, atop the metallic mirror layer, with a conductive material which electrically contacts the auxiliary;

wherein the recess ends in a semiconductor buffer region which is a lowest layer of the semiconductor layer sequence; and wherein a side of the semiconductor layer sequence remote from the semiconductor buffer region is at least partially covered by a passivation layer and subsequently by the auxiliary layer.

* * * * *